(12) United States Patent
Park et al.

(10) Patent No.: US 7,015,743 B2
(45) Date of Patent: Mar. 21, 2006

(54) CIRCUIT OF REDUNDANCY IO FUSE IN SEMICONDUCTOR DEVICE

(75) Inventors: Young Soo Park, Seoul (KR); Yi Jin Kwon, Kyungki-Do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 94 days.

(21) Appl. No.: 10/879,434

(22) Filed: Jun. 29, 2004

(65) Prior Publication Data

US 2005/0073353 A1 Apr. 7, 2005

(30) Foreign Application Priority Data

Oct. 7, 2003 (KR) .................... 10-2003-0069424

(51) Int. Cl.
*H01H 37/76* (2006.01)

(52) U.S. Cl. ................................. 327/525

(58) Field of Classification Search ........... 327/324, 327/325, 326
See application file for complete search history.

(56) References Cited

U.S. PATENT DOCUMENTS

| | | | | |
|---|---|---|---|---|
| 5,173,616 A | * | 12/1992 | Hinooka | ............ 327/525 |
| 5,424,672 A | * | 6/1995 | Cowles et al. | ............ 327/525 |
| 6,566,937 B1 | * | 5/2003 | Mori et al. | ............ 327/525 |

* cited by examiner

*Primary Examiner*—Jeffrey Zweizig
(74) *Attorney, Agent, or Firm*—Marshall, Gerstein & Borun LLP

(57) ABSTRACT

Provided is related to a redundancy IO fuse circuit of a semiconductor device. The redundancy IO fuse circuit is advantageous to enhancing an overall processing speed of a redundancy operation by preventing a voltage drop by a threshold voltage due to an NMOS transistor, by reducing back bias effects, preventing a decrease of noise margins at an inverter connected to an IO bus, and by improving time delay property involved in current reduction according to variation of operation mode.

4 Claims, 2 Drawing Sheets

200
CIRCUIT OF REDUNDANCY IO FUSE IN SEMICONDUCTOR DEVICE

This application relies for priority upon Korean Patent Application No. 2003-0069424 filed on Oct. 7, 2003, the contents of which are herein incorporated by reference in their entirety.

BACKGROUND

1. Field of the Invention

The present invention relates to a redundancy IO (input/output) fuse circuit of a semiconductor device, and specifically, to a redundancy IO fuse circuit for overcoming signal delays arising from IO fuses employed in redundancy circuitry in a semiconductor device.

2. Discussion of Related Art

In a semiconductor device, it has been general to employ fuses in order to control IO (input/output) information to be repaired in a redundancy block. As a normal bit configuration of a semiconductor chip is ×8 or ×16, one repair line needs to be associated with four fuse boxes each of which includes a couple of fuses for setting high and low states.

FIG. 1A illustrates a conventional redundancy IO fuse circuit.

FIG. 1B is a circuit diagram of a region 'A' where a predetermined fuse is blown away in FIG. 1A.

Referring to FIGS. 1A and 1B, the conventional redundancy IO fuse circuit includes first through fourth fuse boxes FB1~FB4 for outputting a predetermined logic signal in accordance with states of an external repair signal REP and fuse cutoff, and first through fourth NMOS transistors N1~N4, connected between an external IO bus IOBUS and the first through fourth fuse boxes FB1~FB4, for transferring an IO information signal to the IO bus IOBUS in accordance with the external repair signal REP.

The first fuse box FB1 is constructed of a first fuse F1 connected between an input terminal of the external repair signal REP and a drain node of the first NMOS transistor N1, and a second fuse connected between a ground voltage Vss and the drain node of the first NMOS transistor. The second through fourth fuse boxes FB2~FB4 have the same structure with the first fuse box FB1, so will be omitted hereinafter.

An operation of the conventional IO fuse circuit shown in FIG. 1A is as follows. First, a defect on a chipset is cured by means of a predetermined test procedure. While this, an alternative one of the first and second fuses F1 and F2 in the first through fourth fuse boxes FB1~FB4 is cut off (or blown out). For example, if IO<9> is to be repaired, the second fuses F2 each of the first and fourth fuse boxes FB1 and FB4 and the first fuses F1 each of the second and third fuse boxes FB2 and FB3 are cut off to set an output of IO bus IOBUS<0:3> on '1001'.

Therefore, when the repair signal REP becomes logically high, the first through fourth NMOS transistors N1~N4 are turned on to output a logical-high signal of the repair signal REP or a logical-low signal of the ground voltage in accordance with fusing states from the first through fourth fuse boxes FB1~FB4. The output signal from the first through fourth fuse boxes FB1~FB4 is transferred to the IO bus IOBUS<0:3> through the first through fourth NMOS transistors N1~N4 that is being turned on.

However, as illustrated in FIG. 1B, when a power supply voltage Vcc is applied to the first NMOS transistor N1 by the condition that the second fuse F2 is cut off and the external repair signal REP is logically high, there is a problem as follows.

First, it occurs a voltage drop by a threshold voltage of the NMOS transistor. Such a voltage drop causes the degradation of noise margins at an inverter connected to the IO bus, which is very disadvantageous to a low voltage chip operable under 1.8V of power supply voltage. Furthermore, the threshold voltage becomes higher due to a back bias effect of the NMOS transistor, making the noise margin of the inverter be degraded worse.

In addition, increasing a bias level of the IO bus causes a current decrease therein by the operational property of the NMOS transistor turns to a saturation mode into a linear mode, which means it takes a longer time for charging nodes of the IO bus and thereby consumes time delays.

Practically, a simulation result under the condition with Vcc=1.65V, slow skew, and 90° C. of temperature results in a transition time of 10 ns for changing the IO bus signal from low to high. And, it is difficult to obtain further improvement beyond about 1 ns although the NMOS transistor is enlarged in size. This time delay is regarded to as a very large value against an entire read/write time specification, acting as a serious factor degrading the performance of chip.

SUMMARY OF THE INVENTION

The present invention is directed to a redundancy IO fuse circuit of a semiconductor device, capable of reducing a back bias drop by a threshold voltage of an NMOS transistor, preventing a decrease of noise margins, and improving time delay property involved in current reduction of the NMOS transistor.

One aspect the present invention is to provide a redundancy Input/Output (IO) fuse circuit of a semiconductor device, including: a plurality of fuse boxes for outputting a predetermined logic signal in accordance with a repair signal and a fuse cutoff state; an inverter for outputting an inversed repair signal by receiving the repair signal; and a plurality of transmission gates for transferring the predetermined logic signal into an IO bus in accordance with the repair signal and the inversed repair signal.

Another aspect of the present invention is to provide a redundancy IO fuse circuit of a semiconductor device, including: an inverter for inversing an external repair signal; a first fuse for transferring a ground voltage in accordance with a cutoff state; a second fuse for transferring a power supply voltage in accordance with a cutoff state; an NMOS transistor for transferring the ground voltage to an IO bus in accordance with the repair signal; and a PMOS transistor for transferring the power supply voltage to the IO bus in accordance with the inversed repair signal provided from the inverter.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Figure 1A:
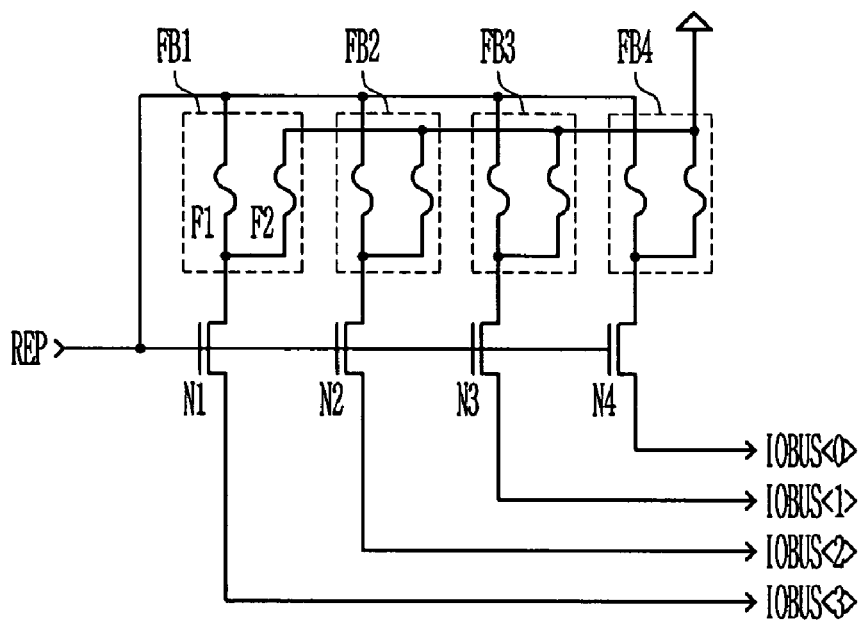
FIG. 1A illustrates a conventional redundancy IO fuse circuit.
Figure 1B:
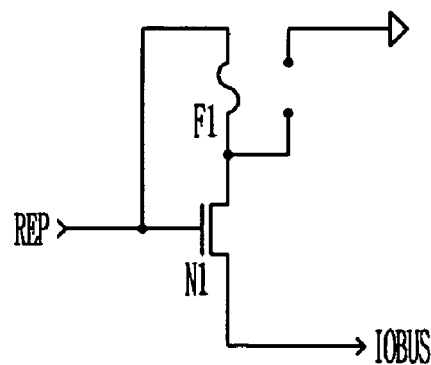
FIG. 1B is a circuit diagram of a region A where a predetermined fuse is blown away in FIG. 1A.
Figure 2:
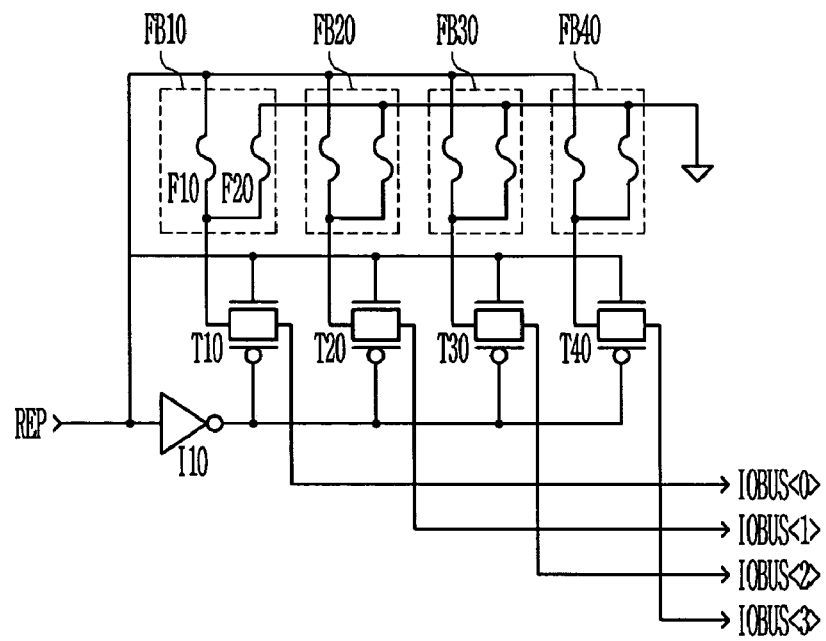
FIG. 2 illustrates a redundancy IO fuse circuit according to an embodiment of the present invention.

FIG. 2 illustrates a redundancy IO fuse circuit according to an embodiment of the present invention.

Referring to FIG. 2, the redundancy IO fuse circuit according to an embodiment of the present invention is comprised of an inverter I10 for inversing a logic state of an external repair signal REP, first through fourth fuse boxes FB10~FB40 for outputting a predetermined logic signal in accordance with states of the repair signal REP and fuse cutoff, and first through fourth transmission gates T10~T40 for each transferring outputs of the first through fourth fuse boxes FB10~FB40 into external IO buses IOBUS<0:3> in accordance with the repair signal REP and an inversed repair signal IREP by the inverter I10. The predetermined logic signal denotes logical high or logical low.

The first fuse box FB10 includes a first fuse F10 connected between an input terminal of the repair signal REP and an output terminal of the first fuse box FB10, and a second fuse F20 connected between a ground voltage Vss and the output terminal of the first fuse box FB10. The second through fourth fuse boxes FB20~FB40 have the same structure with the first fuse box FB10. Here, the first fuse F10 may be connected between a power supply voltage Vcc and the output terminal of the first fuse box FB10.

The first transmission gate T10 is connected between the IO bus (e.g., IOBUS<1>) and the output terminal of the first fuse box FB10, being constructed of an NMOS transistor controlled by the repair signal REP and a PMOS transistor controlled by the inversed repair signal IREP. The second through fourth transmission gates T20~T40 have the same construction with the first transmission gate T10.

Now will be described about an operation of the redundancy IO fuse circuit constituted as aforementioned according to an embodiment of the present invention.

When the external repair signal REP becomes logically high, the first and fourth transmission gates T10 and T40 are turned on and the IO bus signal IOBUS<0:3>are determined to be assigned thereto in accordance with fuse cutoff states of the first and fourth fuse boxes FB10 and FB40. In this embodiment, a time delay is not generated by the PMOS transistor during logically high, while by the NMOS transistor during locally low.

For example, in order to transfer a logical-high signal to the IO bus IOBUS, the second fuse F20 connected to the ground voltage Vss is cut off while the first fuse F10 is maintained. When the external repair signal REP is applied with logically high thereto, the NMOS and PMOS transistors of the first transmission gates T10 are turned on. Thus, the logical-high signal is transferred to the IO bus IOBUS by way of the first fuse F10 of the first fuse box FB10 and the first transmission gate T10. At this time, as the PMOS transistor transfers the power supply voltage to the IO bus without a voltage drop, there is no reduction of noise margin. Moreover, since the PMOS transistor is free from a back bias effect and normally operable in a saturation mode, a current decrease does not occur to let a switching time delay disappeared. As a result, it solves the problem due to the conventional NMOS transistor.

In order to transfer a logical-low signal to the IO bus IOBUS, the first fuse F10 connected to the input terminal of the repair signal REP is cut off while the second fuse F20 is maintained. When the external repair signal REP is applied with logically high thereto, the NMOS and PMOS transistors of the first transmission gates T10 are turned on. Thus, the logical-low signal is transferred to the IO bus IOBUS by way of the second fuse F20 of the fuse box FB10 and the first transmission gate T10. At this time, although the PMOS transistor cannot transfer the power supply voltage and there is a back bias effect, the NMOS transistor well transfers the logical-low signal to the IO bus. And, since the NMOS transistor is operable in a saturation mode, there is no switching time delay.

According to a simulation result under the condition of Vcc=1.65V, slow skew, and 90° C. of temperature, it takes a transition time about 4 ns for changing the IO bus signal from low to high.

As another embodiment of the present invention, it is available to connect PMOS transistors to fuses linked to the power supply voltage and to connect NMOS transistors to fuses linked to the ground voltage, which can reduce time delays.

Figure 3:
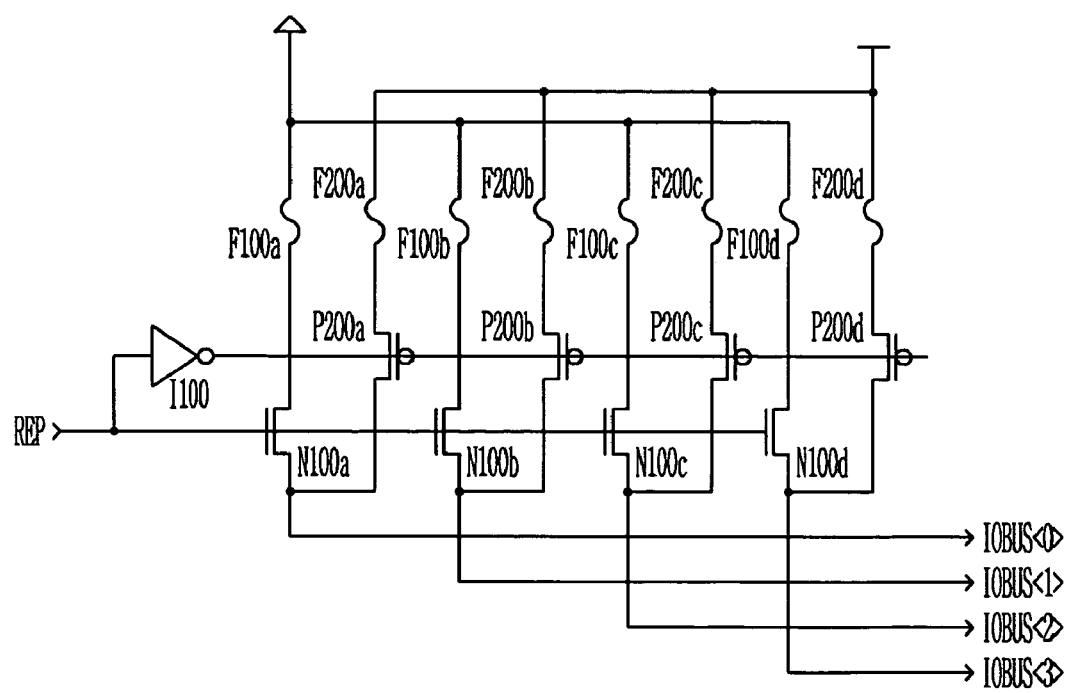
FIG. 3 illustrates a redundancy IO fuse circuit according to another embodiment of the present invention.

FIG. 3 illustrates a redundancy IO fuse circuit according to another embodiment of the present invention.

Referring to FIG. 3, the redundancy IO fuse circuit includes an inverter I100 for inversing a logic state of the repair signal REP, first fuses F100a~F100d for supplying the ground voltage Vss in accordance with their cutoff states, second fuses F200a~F200d for supplying the power supply voltage Vcc in accordance with their cutoff states, NMOS transistors N100a~N100d for transferring the ground voltage Vss to the IO buses IOBUS<0:3> in accordance with a logic state of the repair signal REP, and PMOS transistors P200a~P200d for transferring the power supply voltage Vcc to the IO buses IOBUS<0:3> in accordance with a logic state of the inversed repair signal IREP.

With the structure of the redundancy fuse circuit, when the repair signal REP is applied thereto after cutting away a target fuse of the fuses F100a~F100d or F200a~F200d, the NMOS and PMOS transistors are turned on to transfer voltage states, which are connected to fuses that are not cut off, into IO buses IOBUS corresponding thereto.

In general, as a normal semiconductor chip is operable with a bit configuration of ×8 or ×16, one repair line needs to be associated with four fuse boxes. Therefore, the redundancy IO fuse circuit according to another embodiment of the present invention, as shown in FIG. 3, is constructed as such including the inverter I100 for inversing a logic state of the repair signal REP, the first fuses F100a~F100d for supplying the ground voltage Vss in accordance with their cutoff states, the second fuses F200a~F200d for supplying the power supply voltage Vcc in accordance with their cutoff states, the NMOS transistors N100a~N100d, connected to the first fuses F100a~F100d, for transferring the ground voltage Vss to the IO buses IOBUS<0:3> in accordance with a logic state of the repair signal REP, and the PMOS transistors P200a~P200d, connected to the second fuses F200a~F200d, for transferring the power supply voltage Vcc to the IO buses IOBUS<0:3> in accordance with a logic state of the inversed repair signal IREP.

Consequently, it is possible to reduce a transition time from low to high by a half approximately rather than the case of only using NMOS transistors. The transmission gates employed in the fuse boxes according to the present invention lessens a bias voltage drop by a threshold voltage of an NMOS transistor, prevents a decrease of noise margins due to the voltage drop, and improves the time delay property involved in current reduction of the NMOS transistor.

In summary, the present invention can reduce a bias voltage drop by a threshold voltage of an NMOS transistor, and a back bias effect.

Further, the present invention prevents a decrease of noise margins at an inverter connected to an IO bus.

Moreover, the present invention also enhances a redundancy operation speed by improving the time delay property involved in current reduction of the NMOS transistor in accordance with a change of device operation mode.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A redundancy Input/Output (IO) fuse circuit of a semiconductor device, comprising:
    a plurality of fuse boxes for outputting a predetermined logic signal in accordance with a repair signal and a fuse cutoff state;
    an inverter for outputting an inversed repair signal by receiving the repair signal; and
    a plurality of transmission gates for transferring the predetermined logic signal into an IO bus in accordance with the repair signal and the inversed repair signal.

2. The redundancy IO circuit as recited in claim 1, wherein the fuse box comprises:
    a first fuse connected between an input terminal of the fuse box and an output terminal of the fuse box; and
    a second fuse connected between a ground voltage and the output terminal of the fuse box.

3. The redundancy IO fuse circuit as recited in claim 1, wherein the transmission gates are connected between the output terminals of the fuse boxes and the IO buses in parallel, each having an NMOS transistor controlled by the repair signal and a PMOS transistor controlled by the inversed repair signal.

4. A redundancy IO fuse circuit of a semiconductor device, comprising:
    an inverter for inversing an external repair signal;
    a first fuse for transferring a ground voltage in accordance with a cutoff state;
    a second fuse for transferring a power supply voltage in accordance with a cutoff state;
    an NMOS transistor for transferring the ground voltage to an IO bus in accordance with the repair signal; and
    a PMOS transistor for transferring the power supply voltage to the IO bus in accordance with the inversed repair signal provided from the inverter.

* * * * *